United States Patent [19]

McClure

[11] Patent Number: 5,546,537
[45] Date of Patent: Aug. 13, 1996

[54] METHOD AND APPARATUS FOR PARALLEL TESTING OF MEMORY

[75] Inventor: David C. McClure, Carrollton, Tex.

[73] Assignee: SGS-Thomson Microelectronics, Inc., Carrollton, Tex.

[21] Appl. No.: 410,383

[22] Filed: Mar. 27, 1995

Related U.S. Application Data

[63] Continuation of Ser. No. 85,980, Jun. 30, 1993, abandoned.

[51] Int. Cl.⁶ .............................. G06F 11/00; G11C 7/00
[52] U.S. Cl. ...................... 395/183.21; 365/201
[58] Field of Search .................... 371/21.1, 21.2, 371/21.4, 15.1; 395/183.16, 183.18, 183.21, 183.22, 185.01, 185.06, 185.07; 365/201

[56] References Cited

U.S. PATENT DOCUMENTS

| | | | |
|---|---|---|---|
| 4,654,849 | 3/1987 | White, Jr. et al. | 371/21 |
| 4,744,061 | 5/1988 | Takemae et al. | 365/201 |
| 5,153,459 | 10/1992 | Park et al. | 307/452 |
| 5,168,464 | 12/1992 | Stanchak et al. | 365/185 |
| 5,208,778 | 5/1993 | Kumanoya et al. | 365/201 |
| 5,255,230 | 10/1993 | Chan et al. | 365/201 |
| 5,305,261 | 4/1994 | Furatani et al. | 365/189.01 |

Primary Examiner—Robert W. Beausoliel, Jr.
Assistant Examiner—Norman M. Wright
Attorney, Agent, or Firm—Kenneth C. Hill; Lisa K. Jorgenson

[57] ABSTRACT

A memory includes a number of memory groups. Each memory group includes a set of memory subgroups and a number of data bus drivers, wherein each data bus driver has a true input and a complement input and a true output and a complement output. The true and complement inputs are connected to a memory subgroup by at least one sense amplifier. A true connection point also is included in the memory, and the true output of one of the data bus drivers from each of the memory groups are connected together at the connection point, and a "wired" configuration is created. In addition, the memory includes a complement connection point, wherein the complement output of one of the data bus drivers from each of the memory groups are connected together at the connection point, creating a "wired" configuration. The memory also has a data bus circuit with a true input connected to the true connection point and a complement input connected to the complement connection point and a first circuit. This data bus circuit is responsive to signals from the true and complement connection points created by the simultaneous addressing of multiple groups or a subset of the memory subgroups in testing mode. The first circuit has an output for providing an indication of an error in addressing of the multiple groups or the subset of the memory subgroups.

25 Claims, 5 Drawing Sheets

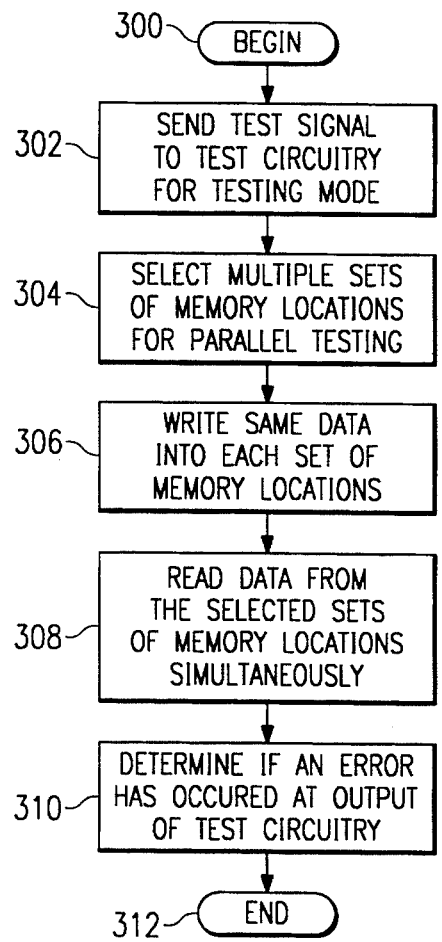
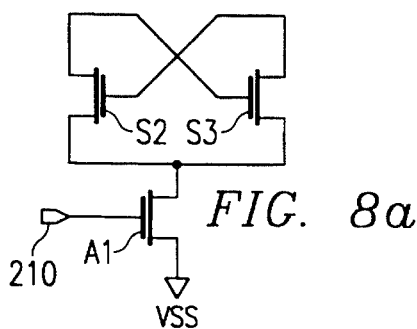
FIG. 8a
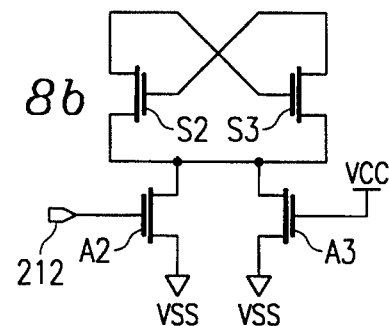
FIG. 8b
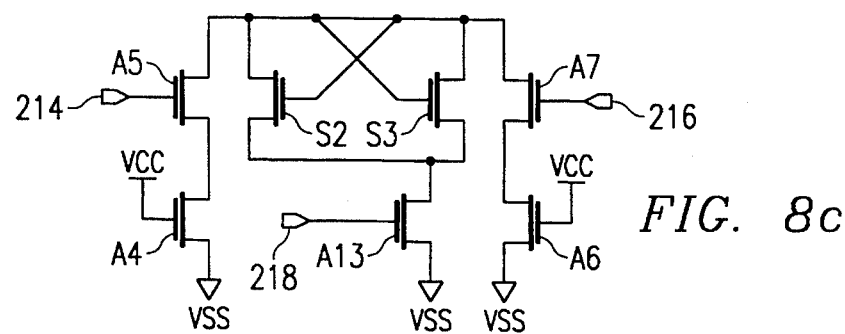
FIG. 8c

METHOD AND APPARATUS FOR PARALLEL TESTING OF MEMORY

This is a continuation of application Ser. No. 08/085,980, filed Jun. 30, 1993, now abandoned.

CROSS-REFERENCE TO RELATED APPLICATIONS

The present application is related to U.S. patent application Ser. No. 08/085,766, now U.S. Pat. No. 5,349,243, entitled "Latch Controlled Output Driver" and U.S. patent application Ser. No. 08/085,588, now U.S. Pat. No. 5,471,415, entitled "Cache Tag Memory" filed of even date herewith by the inventor hereof, assigned to the assignee herein, and incorporated herein by reference.

BACKGROUND OF THE INVENTION

1. Field of the Invention

The present invention relates in general to integrated circuits and in particular to semiconductor memories. Still more particularly, the present invention relates to a method and system for testing semiconductor memories.

2. Description of the Prior Art

Memories are devices that respond to operational orders, usually from a central processing unit. Memories may store large quantities of information in a digital format. In a memory system or unit, addresses are used to access the contents of the memory unit. A binary digit, a bit, is the basic information element stored in memory. The smallest subdivision of a memory unit into which a bit of information can be stored is called a memory cell. A memory on a chip is physically arranged as a two-dimensional array of cells, wherein rows of cells are connected by row lines or, also called word lines. A column of cells are connected by a column line, also called a bit line. These memory cells may be constructed by various configurations of transistors and/or capacitors.

In constructing semiconductor memories, it is desirable to test the memory cells to identify and locate defective memory cells or errors in processing. Additionally, memories are tested to determine the speed and performance of a memory. As the sides of memories increase and as the quantities of memories produced increase, testing of these memories throughout the different stages of processing increases the amount of time and cost needed to produce a semiconductor memory.

More information on semiconductor memories may be found in Haznedar, *Digital Microelectronics*, the Benjamin/Cummings Publishing Company, Inc. (1991). Prince, *Semiconductor Memories*, John Wiley and Sons (2d Ed. 1991).

As a result, it would be desirable to have a method and system for rapidly testing semiconductor memories.

SUMMARY OF THE INVENTION

The present invention provides a memory that includes a number of memory groups. Each memory group includes a set of memory subgroups and a number of data bus drivers, wherein each data bus driver has a true input and a complement input and a true output and a complement output. The true and complement inputs are connected to a memory subgroup by at least one sense amplifier. A true connection point also is included in the memory, and the true output of one of the data bus drivers from each of the memory groups are connected together at the connection point, and a "wired" connection or configuration is created. A "wired" configuration may be for example, a "wired OR" "wired NOR" "wired AND" or "wired NAND" according to the present invention. In addition, the memory includes a complement connection point, wherein the complement output of one of the data bus drivers from each of the memory groups are connected together at the connection point, creating a wired NOR configuration. The memory also has a data bus circuit with a true input connected to the true connection point and a complement input connected to the complement connection point and a first circuit. This data bus circuit is responsive to signals from the true and complement connection points created by the simultaneous addressing of multiple groups or a subset of the memory subgroups in testing mode. The first circuit has an output for providing an indication of an error in addressing of the multiple groups or the subset of the memory subgroups.

The present invention also includes a memory testing apparatus that includes data bus drivers, wherein each data bus driver has a true input and a complement input connected to a set of memory cells and has a true output and a complement output. The true outputs of the data bus drivers are connected together at a first point and the complement outputs of the data bus drivers are connected together at a second point. This apparatus also includes a data bus circuit, that has a pair of inputs, a true input connected to the first point and a complement input connected to the second point, and a pair of outputs. Testing means is provided for simultaneously accessing memory cells in a memory, wherein each of the memory cell's addresses has the same data written into it for a particular data bus circuit output. The apparatus also includes a sensing circuit that is connected to the true and complement output of the data bus circuit. The sensing circuit has an output, indicating an absence of error if the data from all of the memory cells accessed are identical.

The present invention also includes a method for testing a memory by writing data into memory cells or memory cell locations having true and compliment bit lines connected to a plurality of data bus drivers. The data written into each memory cell or group of memory cells is identical for all of the memory cells or groups of memory cells for a particular data bus circuit output. Each data bus driver has a true input and a complement input connected to a true and complement bit line of a memory cell and has a true output and a complement output, wherein the true outputs are connected together at a first point and the complement outputs are connected together at a second point, forming a "wired" configuration. Data is simultaneously read from the memory cells or memory cell locations into a data bus circuit having a pair of inputs, a true input connected to the first point and a complement input connected to the second point, and a pair of outputs connected to a sensing circuit. The sensing circuit has an output, wherein an absence of error is indicated if the data from all of the memory cells accessed are identical for a particular data bus circuit output.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 7 is a high level flowchart of a method for parallel testing of memory locations in a memory unit;

FIGS. 8a–8c are schematic diagrams of additional circuit connections to cross-coupled transistors in the data bus driver illustrated in FIG. 5;

DESCRIPTION OF THE PREFERRED EMBODIMENT

Figure 1:
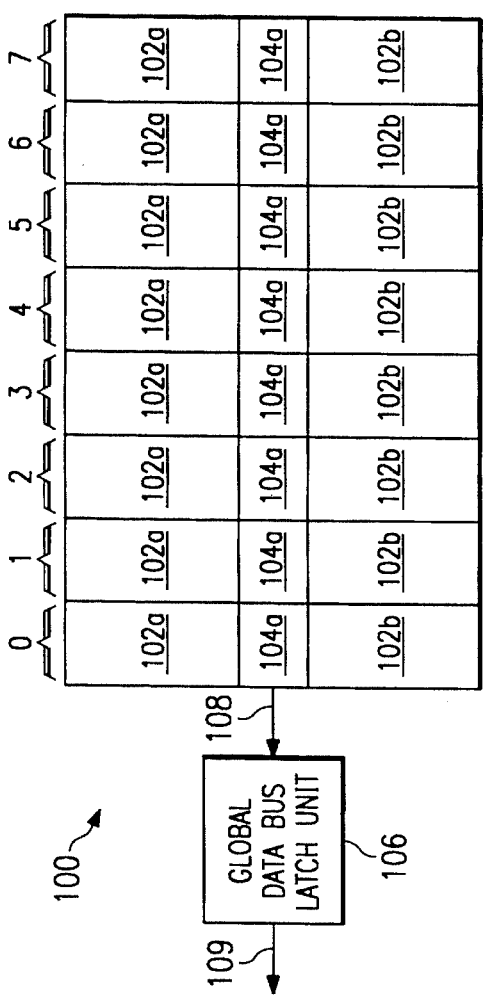
FIG. 1 is a block diagram of a memory unit.

Referring now to FIG. 1, a block diagram of a memory unit 100 is illustrated. Memory unit 100 (also just called a "memory") is subdivided into eight memory groups: 0–7. Each memory group contains a memory block 102a, a memory block 102b, and an input/output (I/O) block 104a. I/O block 104a is interposed between the two memory blocks 102a and 102b. Data bus circuit block 106 is connected to the I/O blocks 104a of memory groups 0–7 via a data array 108. Data bus circuit block 106 also has an output array 109.

Figure 2:
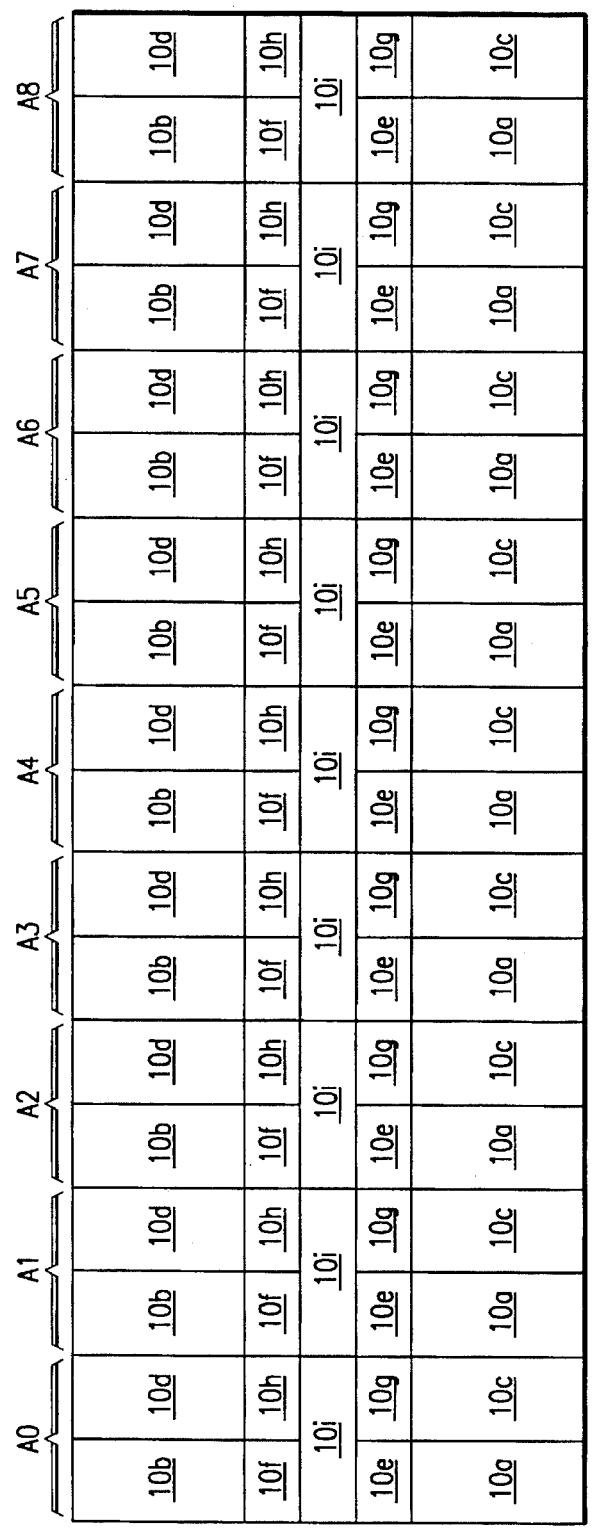
FIG. 2 is a block diagram of a memory group from FIG. 1.

Referring now to FIG. 2, a block diagram of a memory group from FIG. 1, including memory block 102a, memory block 102b, and I/O block 104a is illustrated. Each memory group, 0–7, in FIG. 1 includes nine memory subgroups A0–A8. Each memory subgroup includes four memory segments 10a–10d, four sense amplifiers 10e–10h, and a data bus driver 10i. Each memory segment includes eight columns of bit line pairs and is connected to one of the four sense amplifiers. Such an arrangement is well known to those skilled in the art. In turn, the four sense amplifiers in a memory subgroup are connected to a data bus driver 10i. Each of the data bus drivers 10i in memory subgroups A0–A8 have a pair of data lines, data true (DT) and data complement (DC), connected to data bus circuit 106 in FIG. 1. All of the data lines from all of the I/O blocks form data array 108 in FIG. 1. Each data line is associated with a data output.

Figure 3:
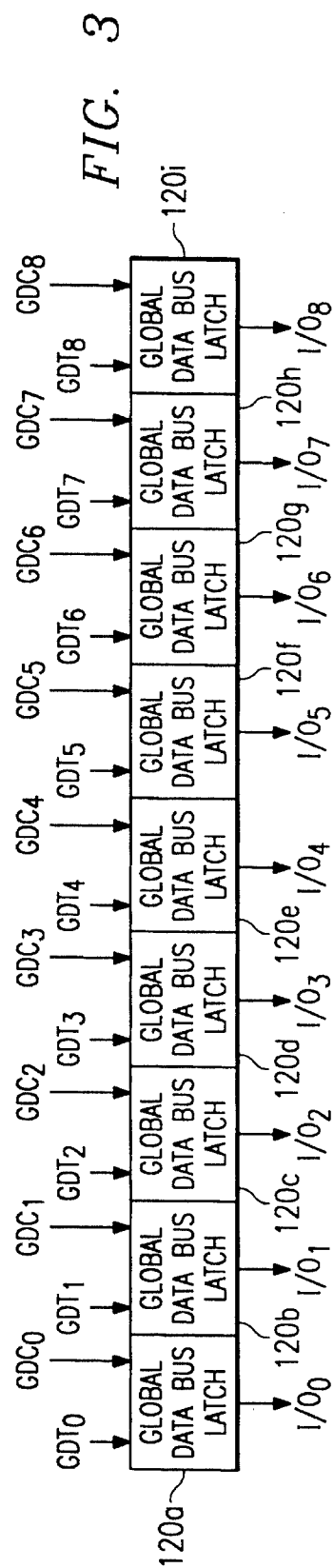
FIG. 3 is a block diagram of a data bus circuit block with a data array and an output array from FIG. 1.

Referring now to FIG. 3, a block diagram of data bus circuit block 106 with data array 108 and output array 109 is illustrated. Data bus circuit block 106 includes data bus circuits 120a–120i. Each data bus circuit has a pair of data lines and a I/O line. The data lines form data array 108 and the I/O lines form output array 109. The data lines from the data buses are connected in a "wired" configuration, specifically a "wired NOR" connection. For example, referring back to FIG. 2, which is representative of a memory group 7 in FIG. 1, the data bus drivers in memory subgroups A0–A8 would have the following connections: A0 to $DT_0$ and $DC_0$, A1 to $DT_1$ and DC1; A2 to $DT_2$ and $DC_1$ ... A8 to $DT_8$ and $DC_8$. Each of the other memory groups 0–6 also would have similar connections to the same data lines $DT_0$, and $DC_0$, $DT_1$, and $DC_1$,; ..., $DT_8$, and $DC_8$. The data bus drivers may be connected together at a connection point, forming a true connection point for $GDT_0$–$GDT_8$ and a complement connection point for $GDC_0$–$GDC_8$ to form a "wired NOR" configuration.

The "wired NOR" data bus drivers provide negative true logic of a OR gate, with the output going low if any input is high or a logic 1. The present invention takes advantage of the "wired NOR" configuration of the data buses. In a test mode, multiple blocks of memory may be selected or enabled and/or multiple sense amplifiers within a block may be enabled. The multiple bits of data being sensed should all have the same data for a given output in accordance with a preferred embodiment of the present invention. The test mode primarily makes use of the existing circuitry and does not diminish the normal performance of the memory unit.

Figure 4:
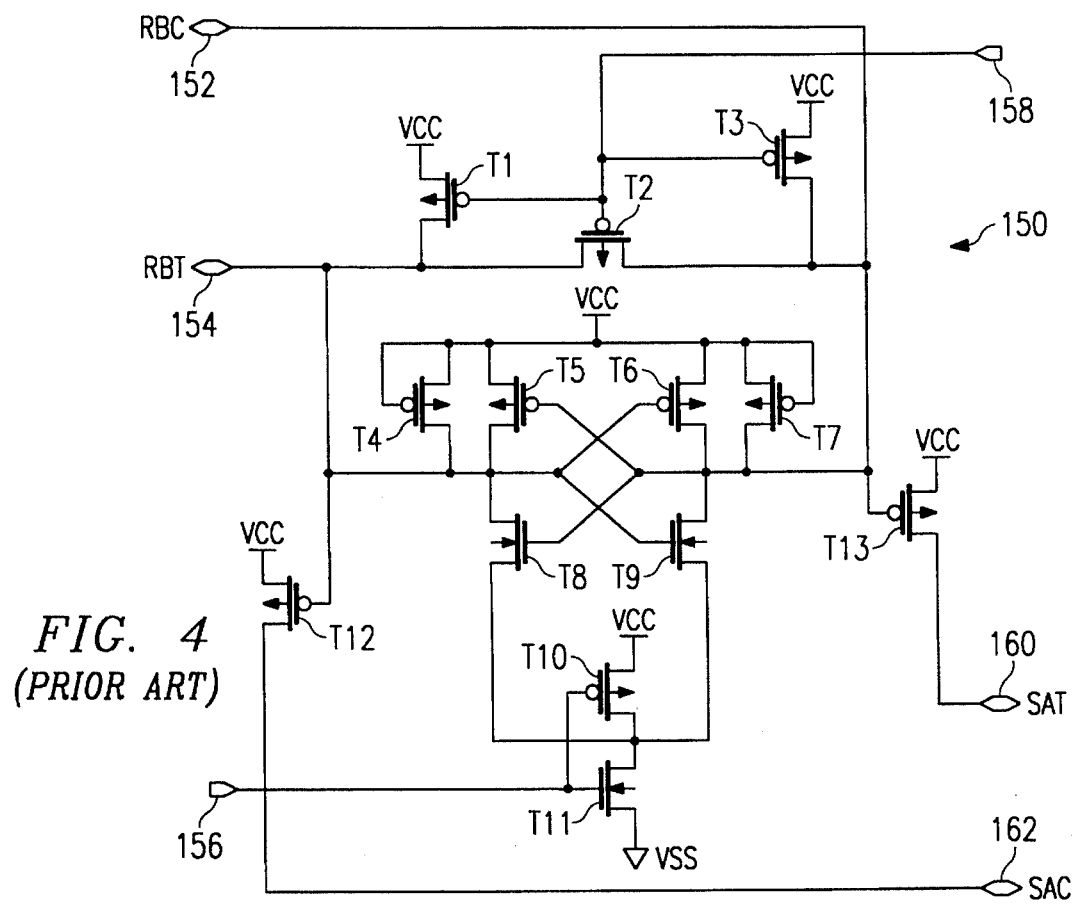
FIG. 4 is a schematic diagram of a sense amplifier known in the prior art.

Referring now to FIG. 4, a schematic diagram of a sense amplifier known in the prior art is depicted. Sense amplifier 150 is constructed from transistors T1–T16. Sense amplifier 150 is a clocked dynamic random access memory (DRAM) style sense amplifier in accordance with a preferred embodiment of the present invention. These transistors are metal-oxide semiconductor field effect transistors (MOSFETs). Transistors T1–T7, T10, T12–T13 are p-channel MOSFETs, while transistors T8–T9 and T11 are n-channel MOSFETs. Sense amplifier 150 is powered by connecting the sources of transistors T1, T3–T7, T10, T12–T13 to power supply voltage VCC and by connecting the source of transistor T11 to power supply voltage VSS. Power supply voltage VCC is typically at a higher voltage than power supply voltage VSS.

Transistors T5 and T6 are cross-coupled; transistor T8 and T9 also are cross-coupled. These transistors form a flip-flop. A signal is input into sense amplifier 150 through points 152 and 154. A complimentary read bus line RBC is connected to point 152, while a true read bus line RBT is connected to point 154. Sense amplifier 150 is enabled and disabled by applying a signal to the gates of transistors T10 and T11 through point 156 and through the gate of transistor T2 via point 158.

When the signal at point 156 and 158 is high transistors T1–T3, and T10 are turned off and transistor T11 is turned on enabling sense amplifier 150. A low signal at point 156 and 158 results in transistors T1–T3 and T10 being turned on and transistor T11 being turned off, disabling sense amplifier 150. The signal enabling sense amplifier 150 is a clocked signal in accordance with a preferred embodiment of the present invention.

Transistors T1–T3 are employed to precharge sense amplifier 150. RBC and RBT are typically high when data signals are not being sent to the sense amplifier, resulting in the gates of transistors T12 and T13 being turned off. When a sense signal is sent into points 156 and 158, typically, only one sense amplifier out of the four in a memory subgroup as illustrated in FIG. 2 normally can be enabled at any given cycle.

Additionally, the four sense amplifiers in a memory subgroup are tied together at points 160 and 162. A high point 152 results in transistor T13 remaining in an off mode. The low signal at point 154 results in transistor T12 being turned on. Output signals are sent through points 160 and 162. Point 160 points a true signal, SAT while the complimentary signal SAC, is sent through point 162. A high signal at point 152 and a low signal at point 154 results in a high signal at point 162 and a low signal at point 160. 8 Referring now to FIG. 5, a schematic diagram of a data bus driver known in the prior art is illustrated. Data bus driver 168 is constructed from transistors S1–S6. The transistors are n-channel MOSFETs. The circuit is powered by connecting the drains of transistors S1–S6 to power supply voltage VSS.

Signals SAT and SAC from sense amplifier 150 are sent into data bus driver 168 at points 170 and 172 by connecting point 160 to point 170 and connecting point 162 to point 172. Data bus driver 168 is precharged to VSS by applying a signal to point 174, which is connected to the gates of transistors S1 and S4. This signal may be a clock signal as used in sense amplifier 150.

A compliment signal, GDC, is output at point 176 and a true signal GDT is output at point 178. Transistors S2 and S3 are connected in a cross-coupled configuration and function as a circuit. When either signal SAT or SAC is high during sensing, one of the transistors S5 or S6 is turned on to selectively pull-down the signal GDT or GDC. When the signal SAC at point 172 is high, signal GDT at point 178 is pulled low, and when the signal SAT at point 170 is high, signal GDC is pulled low at point 176. Data buses connected to points 176 and 178 are precharged high between sensing cycles. As mentioned before, all of the data bus drivers for a particular output for different memory blocks are all tied to the same data lines resulting in a "wired NOR" set up. Multiple data bus drivers 168 are "wired NOR" together at points 176 and 178 and then connected to a data bus circuit.

Figure 6:
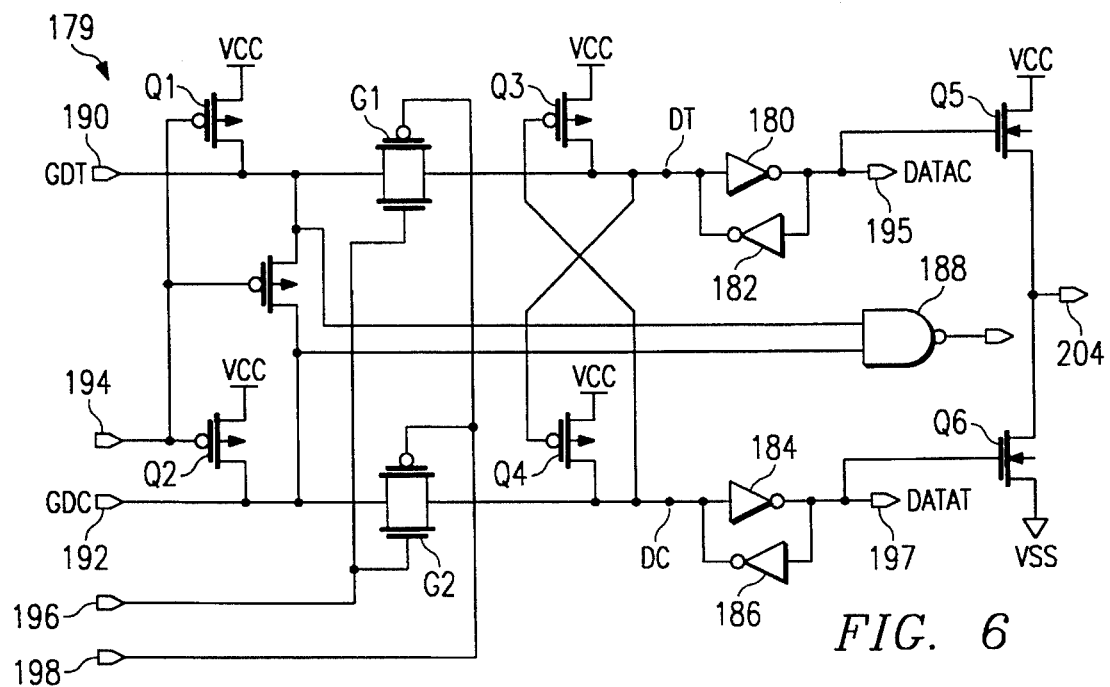
FIG. 6 is a schematic diagram of a data bus circuit.

Referring now to FIG. 6, a schematic diagram of a data bus circuit is illustrated. Data bus circuit 179 is constructed from transistors Q1–Q6, pass gates G1 and inverters 180, 182, 184, and 186; and NAND gate 188. Transistors Q1–Q4 are p-channel MOSFETs while transistors Q5 and Q6 are n-channel MOSFETs. Data bus circuit 179 is powered by connecting transistors Q1–Q5 to power supply voltage VCC and by connecting transistor Q6 to power supply voltage VSS. The GDT and GDC signals at points 190 and 192 are precharged to VCC by applying a signal to point 194, which controls the gates of transistors Q1 and Q2.

Inverters 180 and 182 and inverters 184 and 186 are used as circuits to hold or "circuit" signals from points 190 and 192. Data bus circuit 179 is tied to a data bus driver by connecting point 176 from FIG. 5 to point 192, a complement connection point, and by connecting point 178 from FIG. 5 to point 190, a true connection point. Thus, signal GDT is applied to point 190 while signal GDC is applied to point 192. Pass gates G1 and G2 are employed to allow a signal to pass from points 190 and 192 to the circuits formed by the inverters. These pass gates are controlled by applying signals to points 196 and 198. The pass gates are enabled by applying a high signal to point 196 and a low signal to point 198. Output signals DATAC and DATAT are sent out from data bus circuit 179 at points 195 and 197, respectively. Points DC and DT are reference points for modifications to data bus circuit 179 described below. The output for testing results is at output point 204 and is controlled by signals applied to the gates of transistors Q5 and Q6.

Referring now to FIG. 7, a high level flowchart illustrating a method for parallel testing of memory locations in a memory unit is illustrated. Testing of the memory unit begins in Block 300. Memory cells may be accessed by using address information identifying their location (also called a "memory location") in a memory unit. A test signal is sent to the test circuitry for placing the test circuitry into a testing mode (Block 302). Multiple sets of memory locations are selected for parallel testing (Block 304). A set of memory locations may be one or more memory locations in the memory unit being tested. The same data or groups of data is written into each set of memory cells corresponding to the selected memory locations associated with a particular output, such as output point 204 in FIG. 6 (Block 306). With the test circuitry enabled and in test mode, data is read from the selected sets of memory locations simultaneously (Block 308). Then, a determination is made as to whether an error has occurred in reading data from the selected memory locations at the output (output point 204 in FIG. 6) of the test circuitry (Block 310). Afterwards, the process terminates in Block 312. The internal addresses are forced or "jammed" to access multiple data locations while in test mode.

Referring back to FIG. 5, data bus driver 168 normally requires no alteration in accordance with a preferred embodiment of the present invention. Power consumption may be a concern, particularly if multiple word lines are turned on for multiple memory groups. Another option is to turn on multiple sense amplifiers in a memory subgroup. This may require alteration to the data bus driver because in this case, in the event of an error, both GDT and GDC are pulled low. This implies that both SAT and SAC are high and in conflict with S2 and S3. Power consumption may be reduced by circumventing the cross-coupled n-channel MOSFETs S2 and S3 since both signals SAT and SAC could go high.

Referring to FIG. 8A, a pull-down transistor A1 may be connected to cross-coupled transistors S2 and S3. Transistor A1 is connected to power supply voltage VSS and is turned off during testing mode by applying a low signal to point 210, resulting in the cross-coupled transistors being turned off.

Referring now to FIG. 8B, a pull-down transistor A2 along with a pull-down transistor A3 may be connected to the sources of cross-coupled transistors S2 and S3. As a result, transistor A3 provides a static, weak, pull-down due to sizing of the transistor, while transistor A2 provides a strong pull-down. The cross-coupled transistors S2 and S3 may be weakened by applying a low signal to the gate of transistor A2 through point 212. Transistor A3 has its gate connected to power supply voltage VCC and thus provides a weak pull-down.

Figure 5:
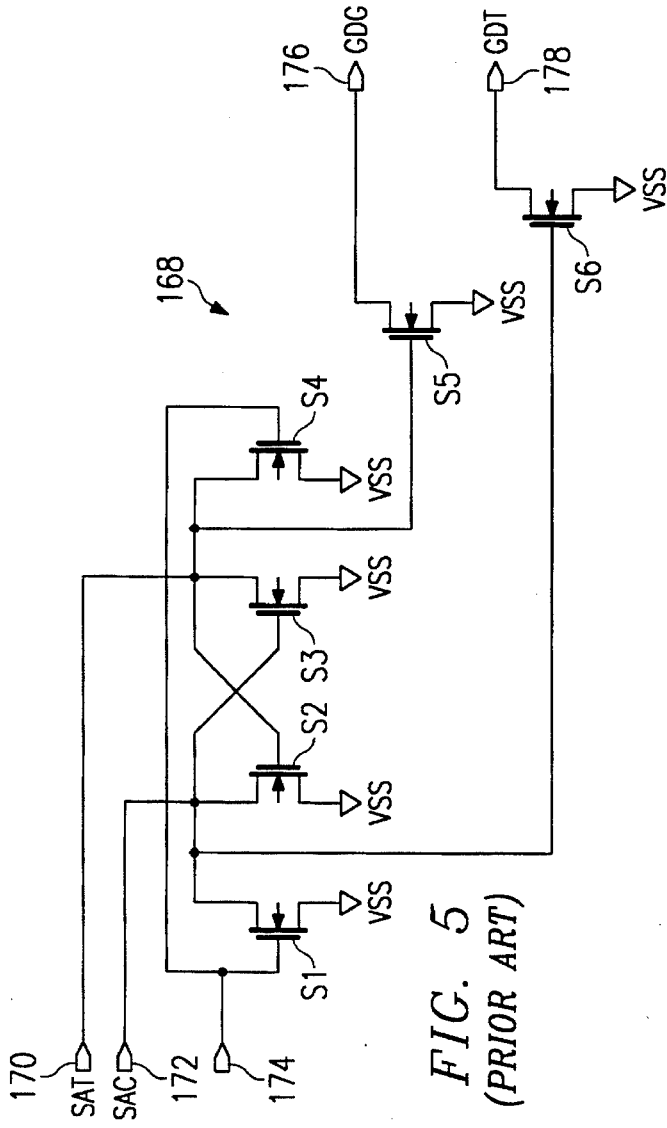
FIG. 5 is a schematic data bus driver known in the prior art.

Referring now to FIG. 8C, a schematic diagram of additional connections to cross-coupled transistors S2 and S3 in data bus driver 168 in FIG. 5 are illustrated. Transistors A4–A7 are employed to provide for disabling the cross-coupled transistors during test mode. Transistors S2 and S3 are disabled by applying a low signal to point 218. Signals at points 214 and 216 go high to provide a weak static, non cross-coupled, load.

During the test mode, the pass gates, G1 and G2, in data bus circuit 179 are forced off to prevent "crowbarring" in transistors Q5 and Q6 in the event of an error. "Crowbarring" occurs when transistors Q5 and Q6 are conducting at the same time. An error occurs when all of the bits for a given output do not match, causing GDT and GDC to be low at the same time.

Figure 9A:
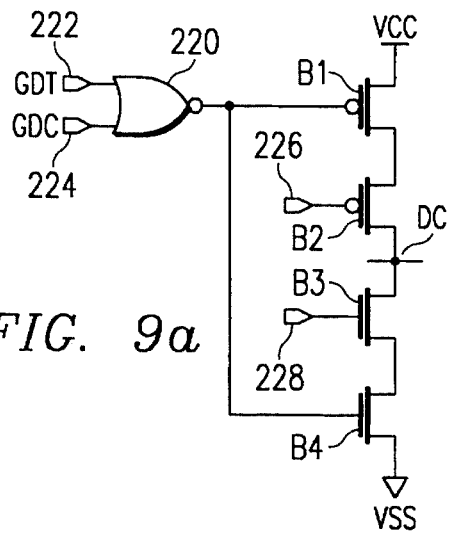
FIGS. 9a–9b are schematic diagrams illustrating additional circuitry for the data bus circuit illustrated in FIG. 6.

Referring now to FIG. 9A, a schematic diagram of additional circuitry for use with data bus circuit 179 in FIG. 6 is illustrated. Transistors B1 and B2 are connected in series with transistors B3 and B4. The source of transistor B1 is connected to power supply voltage VCC while the source of transistor B4 is connected to power supply voltage VSS. Transistors B1 and B2 are p-channel MOSFETs while transistors B3 and B4 are n-channel MOSFETs. Signals GDT and GDC are input into points 222 and 224, which are connected to NOR gate 220. NOR gate 220 controls the gate of transistor B1. The drains of transistors B2 and B3 are connected to point DC corresponding to the same point in data bus circuit 179 in FIG. 6. The signal at point 226 is low and the signal at point 228 is high in test mode. The output of NOR gate 220 is high when an error occurs.

Figure 9B:
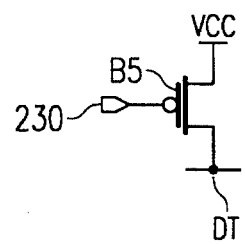

Referring now to FIG. 9B, a p-channel MOSFET has its drain connected to point DT and its source connected to power supply voltage VCC. The gate of transistor B5 is turned on during test mode. The resulting output at point 204 in FIG. 6 is low upon an error and in a tri-state (also called "Hi-Z") mode output otherwise. Output point 204 in data bus circuit may be configured to go high on an error and be in a tri-stated mode otherwise by switching the connection points of DC and DT between the circuitry in FIG. 8a and 8b.

Figure 10:
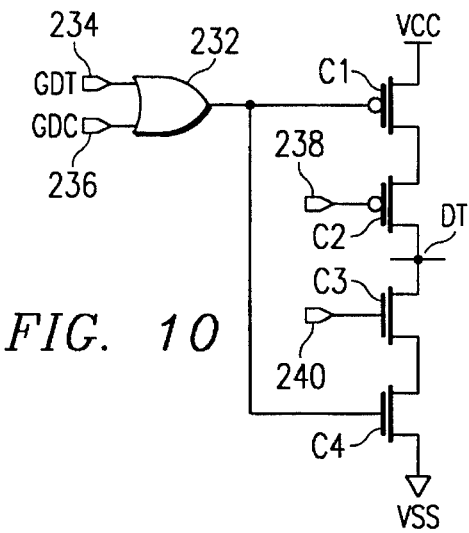
FIG. 10 is a schematic diagram illustrating additional circuitry for use with the data bus circuit illustrated in FIG. 6.

The output at output point 204 in FIG. 6 may be set to output a low signal on an error and a high signal upon the occurrence of no error by using the circuitry connected to point DC as illustrated in FIG. 9a and by connecting the circuitry depicted in FIG. 10 to point DT. FIG. 10 depicts circuitry for connection to point DT. Transistors C1 and C2 are p-channel MOSFETs connected in series with point DT while transistors C3 and C4 are n-channel MOSFETs connected in series with point DT. The source of transistor C1 is connected to power supply voltage VCC while the source of transistor C4 is connected to power supply VSS. The gate of transistor C1 is controlled by the OR gate 232. Signals GDT and GDC are fed into OR gate 232 at points 234 and 236 respectively. When in test mode, the signal at point 238 is low and the signal at point 240 is high, and OR gate 232 is low when an error occurs.

To provide a high signal on an error and a low signal on a condition of no error at point 204 in FIG. 6 in data bus circuit 179, the connections to points DC and DT shown in FIGS. 9A and 10 are reversed.

Figure 11:
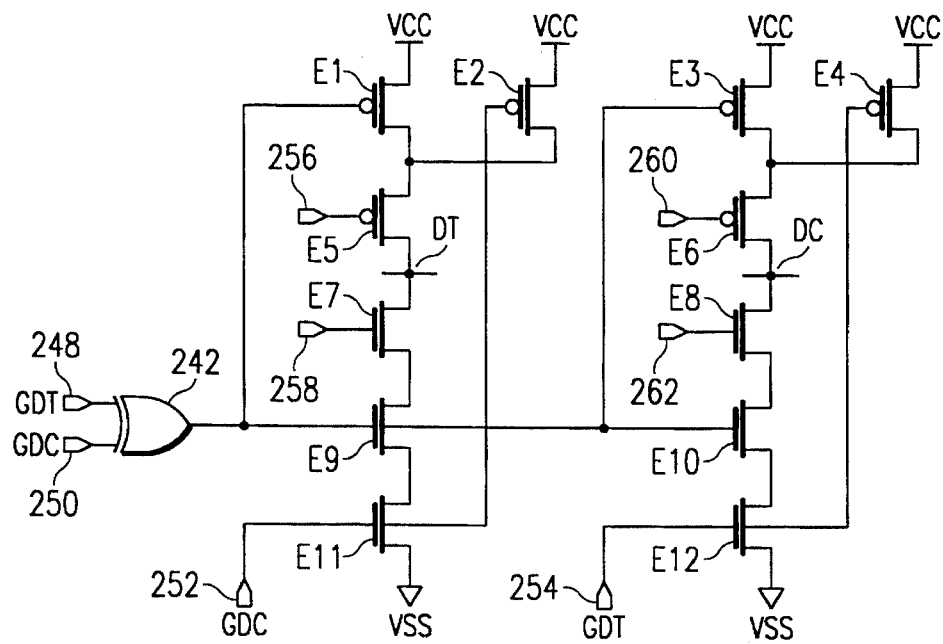
FIG. 11 is a schematic diagram illustrating additional circuitry for use with the data bus circuit illustrated in FIG. 6.

Data bus circuit 179 may be configured to provide a tri-state output on an occurrence of an error at point 204 and otherwise passing data by adding the circuitry shown in FIG. 11 to points DT and DC. Transistors E1 and E2 are connected in parallel with that configuration being connected in series with transistor E5. Similarly, transistors E3 and E4 are connected in parallel with these two transistors being connected in series with transistor E6. The drains of transistors E5 and E6 are connected to points DT and DC respectively.

Additionally, point DT is connected in series with transistors E7–E11 while point DC is connected in series with transistors E8–E12. Transistors E1–E6 are p-channel MOSFETs while transistors E7–E12 are n-channel MOSFETs. The gates of transistors E1, E3, E9, and E10 are controlled by the output from exclusive OR (XOR) gate 242. This gate has signals GDT and GDC fed into it from points 248 and 250 respectively. Moreover, the gates of transistors E2 and E11 are driven by signal GDC applied to point 252. Transistors E4 and E12 are driven by signal GDT applied to point 254. This circuitry is powered by connecting transistors E1–E4 to power supply voltage VCC and transistors E11 and E12 to power supply voltage VSS.

Low signals are applied to points 256 and 260 and high signals are applied to points 258 and 262 to enable the circuitry depicted in FIG. 11 during test mode. When both signals GDT and GDC are high or low, the output at point 204 is in a Hi-Z. When one signal is high and the other signal is low, the data is read out. Consequently, if all four sense amplifiers in a memory subgroup for a data bus circuit are enabled, four words can be read in parallel resulting in a four fold test time reduction. If two memory blocks are enabled in addition to the four sense amplifiers, an eight fold test time reduction occurs.

Writing to memory may be done in parallel as well by overriding the appropriate addresses. Thus, the present invention is extremely useful in reducing the test time needed to test memories. Again, no degradation in normal operating performance occurs and little additional circuitry and bussing of signals is required for test mode.

One advantage of the present invention is that it provides for faster testing of a memory unit by allowing multiple addresses within a memory unit to be read simultaneously. Test circuitry is added to a data bus circuit within the memory unit to identify errors in reading the selected memory locations. As a result, multiple memory segments may be selected for testing and multiple memory groups may be selected for testing. Although the present invention is depicted using MOS technology, other types of technology and transistors may be used in accordance with a preferred embodiment of the present invention. This test mode may be used to detect which output (output point 204 in FIG. 6) has a failing bit.

While the invention has been particularly shown and described with reference to a preferred embodiment, it will be understood by those skilled in the art that various changes in form and detail may be made therein without departing from the spirit and scope of the invention.

What is claimed is:

1. A memory comprising:

a number of memory groups, wherein each memory group includes:

a set of memory subgroups, a number of data bus drivers, wherein each data bus driver has a true input and a complement input and a true output and a complement output, the true and complement inputs being connected to a memory subgroup by at least one sense amplifier;

a true connection point, wherein the true output of one of the data bus drivers from each of the memory groups are connected together at the true connection point, wherein a wired configuration is created, wherein simultaneous addressing of a subset of the memory subgroups generates signals at the true and complement connection points;

a complement connection point, wherein the complement output of one of the data bus drivers from each of the memory groups are connected together at the complement connection point, wherein a wired configuration is created;

a data bus circuit having a true input connected to the true connection point and a complement input connected to the complement connection point and having a first circuit responsive to signals from the true and complement connection points created by simultaneously addressing of a subset of the memory subgroups, the first circuit having an output providing an indication of an error in addressing the subset of the memory subgroups during a test mode, wherein the data bus circuit includes a true output and a complement output and the first circuit includes a first transistor and a second transistor, the first transistor having a gate connected to the true output of the data bus circuit and the second transistor having a gate connected to the complement output of the data bus circuit, the first transistor having a drain connected to an upper power supply voltage, the second transistor having a source connected to the lower power supply voltage, and the source of the first transistor and the drain of the second transistor being connected to an output of the first circuit.

2. The memory of claim 1, wherein the data bus circuit has a second circuit producing a low output at the output of first circuit when both the true and complement inputs of the data bus circuit are low and otherwise producing a Hi-Z output at the output of the first circuit.

3. The memory of claim 2, wherein the second circuit includes:

a first pair p-channel MOSFETs connected in series with a source connected to an upper power supply voltage and a drain connected to the complement output of the data bus circuit and a second pair n-channel MOSFETs connected in series with a source connected to a lower power supply voltage and a drain connected to the complement output of the data bus circuit, wherein the gates of one MOSFETs in each pair is connected to the output of a NOR gate having a first input connected to the true connection point and second input connected to the complement connection point and the gates of the other MOSFETs in each pair is connected to a signal source used to enable the second circuit during testing of the memory; and a p-channel transistor having a source connected to the upper power supply voltage and a drain connected to the true output of the data bus circuit to provide a pull-up on the true output during testing mode.

4. The memory of claim 1, wherein the data bus circuit has a second circuit for producing a high output at the output of first circuit when both the true and complement inputs of the data bus circuit are low and otherwise producing a Hi-Z output at the output of the first circuit.

5. The memory of claim 4, wherein the second circuit includes:

a first pair p-channel MOSFETs connected in series with a source connected to an upper power supply voltage and a drain connected to the true output of the data bus circuit and a second pair n-channel MOSFETs connected in series with a source connected to a lower power supply voltage and a drain connected to the true output of the data bus circuit, wherein the gates of one MOSFETs in each pair is connected to the output of a NOR gate having a first input connected to the true connection point and second input connected to the complement connection point and the gates of the other MOSFETs in each pair is connected to a signal source used to enable the second circuit during testing of the memory; and a p-channel transistor having a source connected to the upper power supply voltage and a drain connected to the complement output of the data bus circuit to provide a pull-up on the complement output during testing mode.

6. The memory of claim 1, wherein the data bus circuit has a second circuit for producing a low output at the output of first circuit when both the true and complement inputs of the data bus circuit are low and otherwise producing a high output at the output of the first circuit.

7. The memory of claim 6, wherein the second circuit includes a first pair p-channel MOSFETs connected in series with a source connected to an upper power supply voltage and a drain connected to the true output of the data bus circuit and a second pair n-channel MOSFETs connected in series with a source connected to a lower power supply voltage and a drain connected to the true output of the data bus circuit, wherein the gates of one of the MOSFETs in each pair is connected to the output of an OR gate having a first input connected to the true connection point and second input connected to the complement connection point and the gates of the other MOSFETs in each pair is connected to a signal source used to enable the second circuit during testing of the memory.

8. The memory of claim 1, wherein the data bus circuit has a second circuit for producing a high output at the output of first circuit when both the true and complement inputs of the data bus circuit are low and otherwise producing a low output at the output of the first circuit.

9. The memory circuit of claim 8, wherein the second circuit includes a first pair p-channel MOSFETs connected in series with a source connected to an upper power supply voltage and a drain connected to the complement output of the data bus circuit and a second pair n-channel MOSFETs connected in series with a source connected to a lower power supply voltage and a drain connected to the complement output of the data bus circuit, wherein the gates of one MOSFETs in each pair is connected to the output of an OR gate having a first input connected to the true connection point and second input connected to the complement connection point and the gates of the other MOSFETs in each pair is connected to a signal source used to enable the second circuit during testing of the memory.

10. The memory of claim 1, wherein the data bus circuit has a second circuit for producing a Hi-Z output at the output of first circuit when both the true and complement inputs of the data bus circuit are low and passing data at the output of the first circuit if either the true or complement input is low and the other input is high.

11. The memory of claim 7, wherein the second circuit includes:

a first and second p-channel transistor connected in a parallel configuration and having drains connected to a source of a third p-channel transistor, the third p-channel transistor having a drain connected to true output of the data bus circuit, and a first, second, and third n-channel transistor connected in series with a drain of the first n-channel transistor connected to the true output of the data bus circuit, wherein the first and second p-channel transistors each have a source connected to an upper power supply voltage and the third n-channel transistor has a source connected to a lower power supply voltage;

a fourth and fifth p-channel transistor connected in a parallel configuration and having drains connected to a source of a sixth p-channel transistor, the sixth p-channel transistor having a drain connected to complement output of the data bus circuit, and a fourth, fifth, and sixth n-channel transistor connected in series with a drain of the fourth n-channel transistor connected to the complement output of the data bus circuit, wherein the fourth and fifth p-channel transistors each have a source connected to an upper power supply voltage and the sixth n-channel transistor has a-source connected to a lower power supply voltage;

an exclusive OR gate with an input connected to the true connection point and an input connected to the complement connection point, the exclusive or gate has an output connected to a gate of the first and fourth p-channel transistor, a gate of the second and fifth n-channel transistor;

the complement connection point being connected to a gate of the second p-channel transistor and to a gate of the third n-channel transistor;

the true connection point being connected to a gate of the fifth p-channel transistor and to a gate of the sixth n-channel transistor; and a test signal connected to a gate of the third and sixth p-channel transistor and connected to a gate of a first and fourth n-channel transistor for enabling and disabling the second circuit.

12. A memory testing apparatus comprising:

a plurality of data bus drivers, each data bus driver having a true input and a complement input connected to a set of memory cells and having a true output and a complement output, wherein the true outputs are connected together at a first point and the complement outputs are connected together at a second point;

a data bus circuit, wherein the data bus circuit has a pair of inputs, a true input connected to the first point and a complement input connected to the second point, and a pair of outputs, a true output and a complement output;

testing means for simultaneously accessing a plurality of memory cells in a memory, wherein each of the memory cells has the same data written into it for given output; and a sensing circuit connected to the true and complement output of the data bus circuit, the sensing circuit having an output, wherein an absence of error is indicated if the data from all of the memory cells accessed are identical, wherein the true and complement connection points are precharged and are both discharged upon the occurrence of an error.

13. A memory testing apparatus comprising:

a plurality of data bus drivers, each data bus driver having a true input and a complement input connected to a set of memory cells and having a true output and a complement output, wherein the true outputs are connected together at a first point and the complement outputs are connected together at a second point;

a data bus circuit, wherein the data bus circuit has a pair of inputs, a true input connected to the first point and a complement input connected to the second point, and a pair of outputs, a true output and a complement output;

testing means for simultaneously accessing a plurality of memory cells in a memory, wherein each of the memory cells has the same data written into it for given output; and a sensing circuit connected to the true and complement output of the data bus circuit, the sensing circuit having an output, wherein an absence of error is indicated if the data from all of the memory cells accessed are identical, wherein the data bus circuit is a data bus latch.

14. A memory testing apparatus comprising:

a plurality of data bus drivers, each data bus driver having a true input and a complement input connected to a set of memory cells and having a true output and a complement output, wherein the true outputs are connected together at a first point and the complement outputs are connected together at a second point;

a data bus circuit, wherein the data bus circuit has a pair of inputs, a true input connected to the first point and a complement input connected to the second point, and a pair of outputs, a true output and a complement output;

testing means for simultaneously addressing a plurality of memory cells in a memory, wherein each of the memory cells has the same data written into it for given output; and simultaneously reading data form the plurality of memory cells into a data bus circuit having a pair of inputs, a true input connected to the first point and a complement input connected to the second point, and a pair of output connected to a sensing circuit, the sensing circuit having an output, wherein an absence of error is indicated if the data from all of the memory cells accessed for a given output are identical; wherein data is read from the plurality of memory cells by simultaneously addressing the plurality of memory cells and, wherein the data bus circuit includes a true output and a complement output and the first circuit includes a first transistor and a second transistor, the first transistor having a gate connected to the true output of the data bus circuit and the second transistor having a gate connected to the complement output of the data bus circuit, the first transistor having a drain connected to an upper power supply voltage, the second transistor having a source connected to the lower power supply voltage, and the source of the first transistor and the drain of the second transistors being connected to an output of the first circuit.

15. The memory testing apparatus of claim 14, wherein the data bus circuit has a second circuit producing a low output at the output of first circuit when both the true and complement inputs of the data bus circuit are low and otherwise producing a Hi-Z output at the output of the first circuit.

16. The memory testing apparatus of claim 14, wherein the data bus circuit has a second circuit for producing a high output at the output of first circuit when both the true and complement inputs of the data bus circuit are low and otherwise producing a Hi-Z output at the output of the first circuit.

17. The memory testing apparatus of claim 15, wherein the second circuit includes a first pair p-channel MOSFETs connected in series with a source connected to an upper power supply voltage and a drain connected to the complement output of the data bus circuit and a second pair n-channel MOSFETs connected in series with a source connected to a lower power supply voltage and a drain connected to the complement output of the data bus circuit, wherein the gates of one MOSFETs in each pair is connected to the output of a NOR gate having a first input connected to the true connection point and second input connected to the complement connection point and the gates of the other MOSFETs in each pair is connected to a signal source used to enable the second circuit during testing of the memory; and a p-channel transistor having a source connected to the upper power supply voltage and a drain connected to the true output of the data bus circuit to provide a pull-up on the true output during testing mode.

18. The memory testing apparatus of claim 16, wherein the second circuit includes:

a first pair p-channel MOSFETs connected in series with a source connected to an upper power supply voltage and a drain connected to the true output of the data bus circuit and a second pair n-channel MOSFETs connected in series with a source connected to a lower power supply voltage and a drain connected to the true output of the data bus circuit, wherein the gates of one MOSFETs in each pair is connected to the output of a NOR gate having a first input connected to the true connection point and second input connected to the complement connection point and the gates of the other MOSFETs in each pair is connected to a signal source used to enable the second circuit during testing of the memory; and a p-channel transistor having a source connected to the upper power supply voltage and a drain connected to the complement output of the data bus circuit to provide a pull-up on the complement output during testing mode.

19. The memory testing apparatus of claim 14, wherein the data bus circuit has a second circuit for producing a low output at the output of first circuit when both the true and complement inputs of the data bus circuit are low and otherwise producing a high output at the output of the first circuit.

20. The memory testing apparatus of claim 19, wherein the second circuit includes a first pair p-channel MOSFETs connected in series with a source connected to an upper power supply voltage and a drain connected to the true output of the data bus circuit and a second pair n-channel MOSFETs connected in series with a source connected to a lower power supply voltage and a drain connected to the true output of the data bus circuit, wherein the gates of one of the MOSFETs in each pair is connected to the output of an OR gate having a first input connected to the true connection point and second input connected to the complement connection point and the gates of the other MOSFETs in each pair is connected to a signal source used to enable the second circuit during testing of the memory.

21. The memory testing apparatus of claim 14, wherein the data bus circuit has a second circuit for producing a high output at the output of first circuit when both the true and complement inputs of the data bus circuit are low and otherwise producing a low output at the output of the first circuit.

22. The memory testing apparatus of claim 21, wherein the second circuit includes a first pair p-channel MOSFETs connected in series with a source connected to an upper power supply voltage and a drain connected to the complement output of the data bus circuit and a second pair n-channel MOSFETs connected in series with a source connected to a lower power supply voltage and a drain connected to the complement output of the data bus circuit, wherein the gates of one MOSFETs in each pair is connected to the output of an OR gate having a first input connected to the true connection point and second input connected to the complement connection point and the gates of the other MOSFETs in each pair is connected to a signal source used to enable the second circuit during testing of the memory.

23. The memory testing apparatus of claim 14, wherein the data bus circuit has a second circuit for producing a Hi-Z output at the output of first circuit when both the true and complement inputs of the data bus circuit are low and passing data at the output of the first circuit if either the true or complement input is low and the other input is high.

24. The memory testing apparatus of claim 23, wherein the second circuit includes a pair of p-channel MOSFETs connected in parallel with their drains connected to an upper power supply voltage and their sources connected together.

25. The memory testing apparatus of claim 23, wherein the second circuit includes:

a first and second p-channel transistor connected in a parallel configuration and having drains connected to a source of a third p-channel transistor, the third p-channel transistor having a drain connected to true output of the data bus circuit, and a first, second, and third n-channel transistor connected in series with a drain of the first n-channel transistor connected to the true output of the data bus circuit, wherein the first and second p-channel transistors each have a source connected to an upper power supply voltage and the third n-channel transistor has a source connected to a lower power supply voltage;

a fourth and fifth p-channel transistor connected in a parallel configuration and having drains connected to a source of a sixth p-channel transistor, the sixth p-channel transistor having a drain connected to-complement output of the data bus circuit, and a fourth, fifth, and sixth n-channel transistor connected in series with a drain of the fourth n-channel transistor connected to the complement output of the data bus circuit, wherein the fourth and fifth p-channel transistors each have a source connected to an upper power supply voltage and the sixth n-channel transistor has a source connected to a lower power supply voltage;

an exclusive OR gate with an input connected to the true connection point and an input connected to the complement connection point, the exclusive or gate has an output connected to a gate of the first and fourth p-channel transistor, a gate of the second and fifth n-channel transistor;

the complement connection point being connected to a gate of the second p-channel transistor and to a gate of the third n-channel transistor;

the true connection point being connected to a gate of the fifth p-channel transistor and to a gate of the sixth n-channel transistor; and a test signal connected to a gate of the third and sixth p-channel transistor and connected to a gate of a first and fourth n-channel transistor for enabling and disabling the second circuit.

* * * * *

UNITED STATES PATENT AND TRADEMARK OFFICE

CERTIFICATE OF CORRECTION

PATENT NO.    : 5,546,537

DATED         : August 13, 1996

INVENTOR(S)   : David C. McClure

It is certified that error appears in the above-identified patent and that said Letters Patent is hereby corrected as shown below:

In claim 11, column 10, line 33, after "claim" delete "7" and insert --10--.

Signed and Sealed this

Twenty-fourth Day of December, 1996

Attest:

BRUCE LEHMAN

Attesting Officer   Commissioner of Patents and Trademarks